United States Patent [19]

Saitoh et al.

[11] Patent Number: 4,801,474

[45] Date of Patent: Jan. 31, 1989

[54] METHOD FOR FORMING THIN FILM MULTI-LAYER STRUCTURE MEMBER

[75] Inventors: Keisha Saitoh, Nabari; Masaaki Hirooka, Toride; Junichi Hanna; Isamu Shimizu, both of Yokohama, all of Japan

[73] Assignee: Canon Kabushiki Kaisha, Tokyo, Japan

[21] Appl. No.: 1,878

[22] Filed: Jan. 9, 1987

[30] Foreign Application Priority Data

Jan. 14, 1986 [JP] Japan ................... 61-4365
Jan. 14, 1986 [JP] Japan ................... 61-4366

[51] Int. Cl.⁴ .................. C23C 16/00; C23C 16/30
[52] U.S. Cl. .................. 427/248.1; 427/255; 427/255.1; 427/255.2; 427/255.3; 427/255.7; 437/233; 437/234
[58] Field of Search ............ 427/86, 85, 248.1, 255, 427/255.1, 255.2, 255.3, 255.7, 87, 250; 437/233, 234

[56] References Cited

U.S. PATENT DOCUMENTS

| | | | |
|---|---|---|---|
| 3,306,768 | 1/1964 | Peterson | 427/255.3 |
| 4,217,374 | 8/1980 | Ovshinsky et al. | 427/86 |
| 4,226,898 | 10/1980 | Ovshinsky et al. | 427/86 |
| 4,504,518 | 3/1985 | Ovshinsky et al. | 427/86 |
| 4,522,663 | 6/1985 | Ovshinsky et al. | 427/86 |
| 4,554,180 | 11/1985 | Hirooka | 427/248.1 |
| 4,568,626 | 2/1986 | Ogawa | 427/39 |
| 4,637,895 | 1/1987 | Ovshinsky et al. | 427/39 |
| 4,637,938 | 1/1987 | Lee et al. | 427/53.1 |
| 4,657,777 | 4/1987 | Hirooka et al. | 427/39 |
| 4,664,937 | 5/1987 | Ovshinsky et al. | 427/86 |

FOREIGN PATENT DOCUMENTS 2038086 7/1980 United Kingdom ........... 427/87
2148328 5/1985 United Kingdom ........... 427/248.1

Primary Examiner—Sadie Childs
Attorney, Agent, or Firm—Fitzpatrick, Cella, Harper & Scinto

[57] ABSTRACT

A method for forming a thin multi-layer structure member having at least one of at least one kind of a semiconductor thin film controlled in valence electron and a semiconductor thin film regulated in band gap comprises forming at least one layer of said semiconductor thin films on a substrate by introducing a precursor (B) formed in a decomposition space (B) which becomes the starting material for deposited film formation and an active species (C) formed in a decomposition space (C) which interacts with said precursor (B) separately into a deposition space (A) for forming a thin film to thereby effect chemical reaction through the interaction between said precursor (B) and said active species (C), and forming at least one layer of other thin films by introducing a gaseous starting material (a) for thin film formation and a gaseous halogenic oxidizing agent having the property of oxidation action for said starting material (a) into a reaction space to effect contact therebetween to thereby form chemically a plural number of precursors including precursors under excited state and using at least one precursor of the precursors as the feeding source for the constituent element of the deposited film.

7 Claims, 2 Drawing Sheets

METHOD FOR FORMING THIN FILM MULTI-LAYER STRUCTURE MEMBER

BACKGROUND OF THE INVENTION

1. Field of the Inveniton

This invention relates to a method for formation of a thin film multi-layer structure member for electronic devices such as thin film semiconductor devices, photovoltaic devices, photosensitive devices for electro- photography.

2. Related Background Art

In the prior art, for functional films, especially amorphous or polycrystalline semiconductor films individually suitable film forming methods have been employed from the standpoint of desired physical characteristics, uses, etc.

For example, for formation of silicon deposited films such as amorphous or polycrystalline non-single crystalline silicon which are optionally compensated for lone pair electrons with a compensating agent such as hydrogen atoms (H) or halogen atoms (X), etc., (hereinafter abbreviated as "NON-Si (H,X)", particularly "A Si (H,X)" when indicating an amorphous silicon and "poly-Si (H,X)" when indicating a polycrystalline silicon) (the so-called microcrystalline silicon is included within the category of A-Si (H,X) as a matter of course), there have been attempted the vacuum vapor deposition method, the plasma CVD method, the thermal CVD method, the reactive sputtering method, the ion plating method, the optical CVD method, etc. Generally, the plasma CVD method has been widely used and industrialized.

However, the reaction process in formation of a silicon-based deposited film according to the plasma CVD method which has been generalized in the prior art is considerably complicated as compared with the other CVD methods of the prior art, and its reaction mechanism involves not a few ambiguous points. Also, there are a large number of parameters for formation of a deposited film (for example, substrate temperature, flow rate and flow rate ratio of the introduced gases, pressure during formation, high frequency power, electrode structure, structure of the reaction vessel, speed of evacuation, plasma generating system, etc.). By combination of such a large number of parameters, the plasma may sometimes become unstable state, whereby marked deleterious influences were exerted frequently on the deposited film formed. Besides, the parameters characteristic of the device must be selected for each device and therefore under the present situation it has been difficult to generalize the production conditions.

On the other hand, for the silicon-based deposited film to exhibit sufficiently satisfactory electric and optical characteristics for respective uses, it is now accepted that the best method to form it is according to the plasma CVD method.

However, depending on the application use of the silicon-based deposited film, bulk production with reproducibility must be attempted with full satisfaction of enlargement of area, uniformity of film thickness as well as uniformity of film quality, and therefore in formation of a silicon-based deposited film according to the plasma CVD method, enormous installation investment is required for a bulk production device and also management items for such bulk production become complicated, with management tolerance being narrow and the control of the device being severe. These are pointed as the problems to be improved in the future.

Also, in the case of the plasma CVD method, since plasma is directly generated by high frequency or microwave, etc., in the deposition space in which a substrate on which film is formed is arranged, electrons or a number of ion species generated may cause damaged to the film in the film forming process to cause lowering in film quality or non-uniformization of film quality.

Particularly, in the case of a semiconductor device having a multi-layer structure, the state of the interfaces between the respective layers has been known to effect greatly the characteristics of the device. Accordingly, for example, in the case of preparing a photosensitive member for electrophotography, since starting gas species, flow rates and plasma discharging intensities, etc. differ largely from layer to layer during deposition of longer wavelength-light absorbing layer, charge injection preventing layer, photosensitive layer, surface protective layer, etc. on a substrate, complete gas exchange is effected with discharging being stopped, a varied layer is provided which is formed by varying gradually the gas species, flow rate and plasma discharging intensity, or alternatively the respective deposited layers are formed in separated deposition chambers, thereby attempting to improve the device characteristics through improvement of the state of the interfaces between the respective deposited layers. However, according to any of these methods, no satisfacotry change or improvement of the device characteristics could be recognized.

As described above, in formation of siliconbased deposited film, the points to be solved still remain, and it has been earnestly desired to develop a method for forming a deposited film which is capable of bulk production by attempting to effect conservation of energy by means of a device of low cost, while maintaining the characteristics as well as uniformity which are practically available.

Particularly, it has been desired earnestly to develop a formation method which can improve the interface state of a thin film multi-layer structure member such as thin film transistors, photovoltaic devices, photosensitive members for electrophotography, etc. and a method for forming a multi-layer structure member having good interface state which can improve the characteristics of the devices.

SUMMARY OF THE INVENTION

An object of the present invention is to provide a novel method for forming a thin film multi-layer structure member without use of the formation method of the prior art simultaneously with removal of the drawbacks of the methods for forming a thin film multi-layer structure member as described above.

Another object of the present invention is to provide a method for forming a thin film multilayer structure having at least one layer of a semiconducting deposited film having at least one band gap regulator and a valence electron controller added therein and having uniform characteristics over large area with easy management of film quality while effecting energy saving.

Still another object of the present invention is to provide a method for forming a thin film multilayer structure member excellent in productivity, bulk productivity, having high quality and excellent physical properties such as electrical, optical and semiconducting properties, etc.

DESCRIPTION OF THE PREFERRED EMBODIMENTS

The method for forming a thin film multilayer structure member according to the present invention is a method for forming a thin film multilayer structure member having at least one of at least one kind of a semiconductor thin film controlled in valence electron and a semiconductor thin film regulated in band gap, which comprises forming at least one layer of said semiconductor thin films on a substrate by introducing a precursor (B) formed in a decomposition space (B) which becomes the starting material for deposited film formation and an active species (C) formed in a decomposition space (C) which interacts with said precursor (B) separately into a deposition space (A) for forming a thin film to thereby effect chemical reaction through the interaction between said precursor (B) and said active species (C) (hereianfter, this forming method is referred to as "HRCVD"), and forming at least one layer of other thin films by introducing a gaseous starting material (a) for thin film formation and a gaseous halogenic oxidizing agent having the property of oxidation action for said starting material (a) into a reaction space to effect contact therebetween to thereby form chemically a plural number of precursors including precursors under excited state and using at least one precursor of the precursors as the feeding source for the constituent element of the deposited film (hereinafter, this forming method is referred to as "FOCVD").

According to the method for formation of a thin film multi-layer structure member of the present invention, a thin film multi-layer structure member with good layer interface characteristics can be obtained, and formation of the respective deposited thin films can be done with simplification of management and bulk production as well as full satisfaction of, uniformity of film thickness and uniformity of film quality simultaneously with conservation of energy, without requiring enormous installation investment for bulk production apparatus, and also the management items for its bulk production become clear to afford broad management tolerance and simple control of the device.

The above gaseous starting material (a) receives oxidizing action through chemical contact with a gaseous halogenic oxidizing agent and can be selected suitably as desired depending on the kind, the characteristic, use, etc., of the desired deposited film. In the present invention, the above gaseous starting material (a) and the gaseous halogenic oxidizing agent may be those which can be made gaseous when introduced into a reaction space to contact with each other, and they can be either liquid or solid as ordinary state.

When the gaseous starting material (a) for thin film formation or a halogenic oxidizing agent is liquid or solid, they are introduced in gaseous state into the reaction space by performing bubbling with the use of carrier gas such as Ar, He, $N_2$, $H_2$, etc., optionally with application of heat.

During this operation, the partial pressures and mixing ratio of the above gaseous starting material (a) and the gaseous halogenic oxidizing agent may be set by controlling the flow rate of the carrier gas and the vapor pressures of the gaseous starting material (a) and the gaseous halogenic oxidizing agent.

As the starting material (a) for thin film formation to be used in the present invention, for example, if tetrahedral type deposited films such as semiconducting or electrically insulating silicon-based deposited films or germanium-based deposited films, etc., are desired to be obtained straight chain and branched chain silane compounds, cyclic silane compounds, chain germanium compounds, etc., may be employed as effective ones.

Specifically, examples of straight chain silane compounds may include $Si_nH_{2n+2}$ (n=1, 2, 3, 4, 5, 6, 7, 8), examples of branched chain silane compounds include $SiH_3SiH(SiH_3)SiH_2SiH_3$, examples of cyclic silane compounds include $Si_nH_{2n}$ (n=3,4, 5, 6), and example of chain germanium compounds include $Ge_mH_{2m+2}$ (m=1, 2, 3, 4, 5), etc. Otherwise, for example, if deposited films of tin are desired to be prepared, hydrogenated tin such as $SnH_4$, etc., may be employed as effective starting material.

Of course, these starting materials may be used either as a single kind or as a mixture of two or more kinds.

The halogenic oxidizing agent to be used in the present invention is made gaseous when introduced into the reaction space and at the same time has the property of effectively oxidizing the gaseous starting material (a) for formation of a deposited film introduced into the reaction space by mere chemical contact therewith, including halogen gas such as $F_2$, $Cl_2$, $Br_2$, $I_2$, etc., and fluorine, chlorine, bromine, etc., under nascent state as effective ones.

These halogenic oxidizing agents are introduced into the reaction space under gaseous state together with the gas of the starting material (a) for formation of a deposited film as described above with desired flow rate and feeding pressure being given, wherein they are mixed with and collided against the above starting material (a) to be chemically contacted therewith, thereby oxidizing the above starting material (a) to generate efficiently a plural kinds of precursors containing precursors under excited state. Of the precursors under excited state and other precursors generated, at least one of them function as the feeding source for the constituent element of the deposited film formed.

The precursors generated may undergo decomposition or reaction to be converted to other precursors under excited state or to precursors under another excited state, or alternatively in their original forms, if desired, although releasing energy to contact the substrate surface arranged in a deposition space (A) spatially communicated with the reaction space, whereby a deposited film with a three-dimensional network structure is formed when the substrate surface temperature is relatively low, or a deposited film with a crystalline structure is formed when the substrate surface temperature is relatively higher.

In the present invention, so that the deposit film forming process may proceed smoothly to form a film of high quality and having desired physical characteristics, as the film forming factors, the kinds and combination of the starting material (a) and the halogenic oxidizing agent, mixing ratio of these, pressure during mixing, flow rate, the inner pressure in the film forming space, the flow types of the gases, the film forming temperature (substrate temperature and atmosphere temperature) are suitably selected as desired. These film forming factors are organically related to each other, and they are not determined individually but determined respectively under mutual relationships. In the present invention, the ratio of the gaseous starting material (a) for forming of a deposited film and the gaseous halogenic oxidizing agent introduced into the reaction space may be determined suitably as determined in relationship of the film forming factors related among the film forming factors as mentioned above, but it is preferably 1/20 to 100/1, more preferably 1/5 to 50/1 in terms of flow rate ratio introduced.

The pressure during mixing when introduced into the reaction space may be preferably higher in order to enhance the chemical contact between the above gaseous starting material (a) and the above gaseous halogenic oxidizing agent in probability, but it is better to determine the optimum value suitably as desired in view of the reactivity. Although the pressure during mixing may be determined as described above, each of the pressure during introduction may be preferably $1 \times 10^{-7}$ atom to 5 atom, more preferably $1 \times 10^{-6}$ atom to 2 atom.

The pressure within the deposition space (A), namely the pressure in the space in which the substrate for film formation on its surface is arranged may be set suitably as desired so that the precursors (E) under excited state generated in the reaction space and sometimes the precursors (D) formed as secondary products from said precursors (E) may contribute effectively to film formation.

The inner pressure in the deposition space (A), when the deposition space (A) is continuous openly to the reaction space, can be controlled in relationship with the introduction pressures and flow rates of the gaseous starting material (a) for formation of a deposited film and a gaseous halogenic oxidizing agent in the reaction space, for example, by application of a contrivance such as differential evacuation or use of a large scale evacuating device.

Alternatively, when the conductance at the connecting portion between the reaction space and the deposition space (A) is small, the pressure in the deposition space (A) can be controlled by providing an appropriate evacuating device in the deposition space (A) and controlling the evacuation amount of said device.

On the other hand, when the reaction space and the deposition space (A) are integrally made and the reaction position and the depositing position are only different in space, it is possible to effect differential evacuation or provide a large scale evacuating device having sufficient evacuating capacity as described above.

As described above, the pressure in the deposition space (A) may be determined in the relationship with the introduction pressures of the gaseous starting material and the gaseous halogenic oxidizing agent introduced into the reaction space, but it is preferably 0.001 Torr to 100 Torr, more preferably 0.01 Torr to 30 Torr, optimally 0.05 Torr to 10 Torr.

Figure 1:
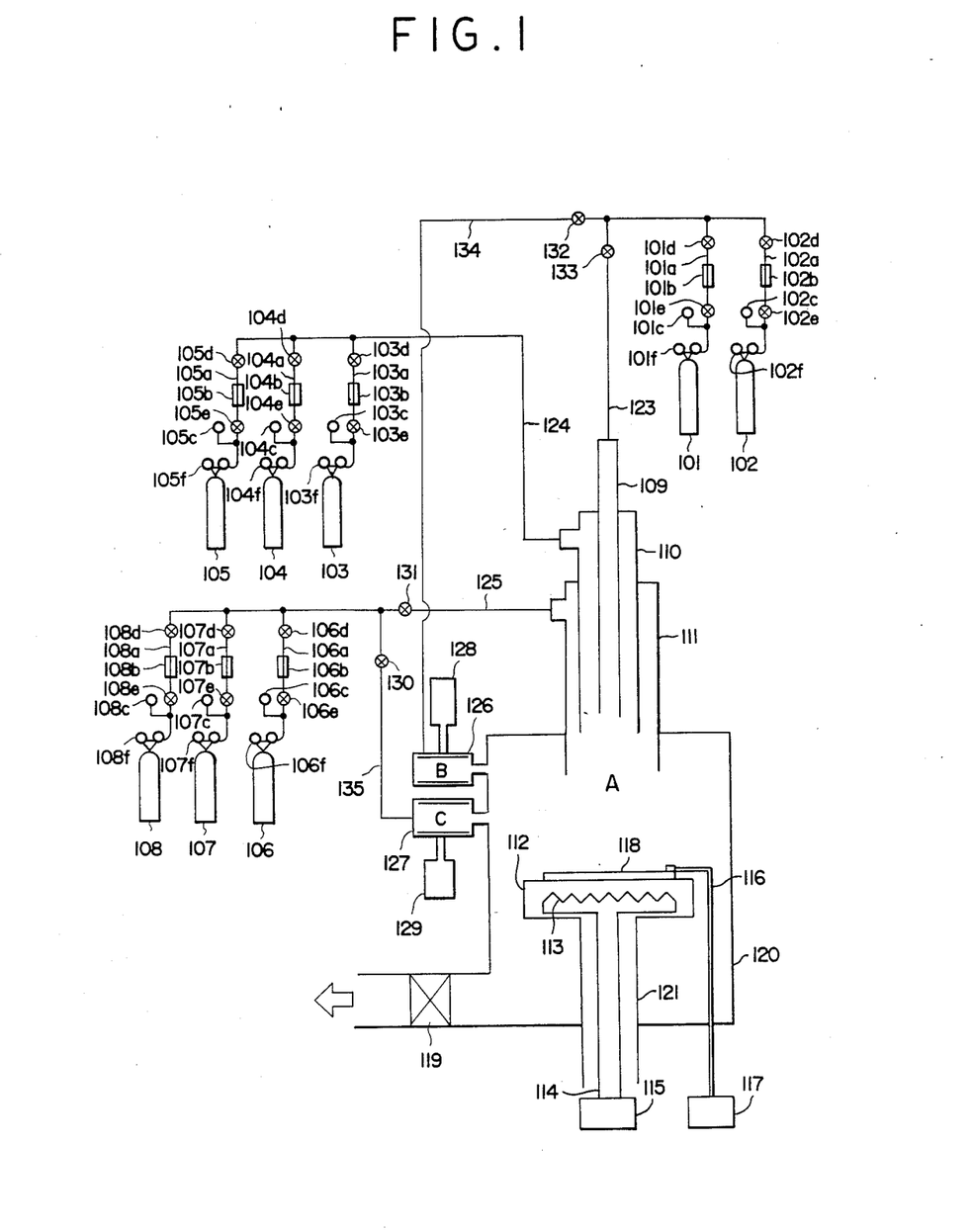
FIG. 1 illustrates schematically the constitution of an example of the film forming device for embodying the method of the present invention.

As for the flow type of the gases, it is necessary to design the flow type in view of the geometric arrangement of the gas introducing inlet, the substrate and the gas evacuating outlet so that the starting material for formation of a deposited film and the halogenic oxidizing agent may be efficiently mixed during introduction of these into the reaction space, the above precursors (E) may be efficiently generated and film formation may be adequately done without trouble. A preferable example of the geometric arrangement is shown in FIG. 1, as described below.

As the substrate temperature (Ts) during film formation, it can be set suitably as desired individually depending on the gas species employed and the kinds and the required characteristics of the deposited film formed, but, in the case of obtaining an amorphous film, it is preferably from room temperature to 450° C., more preferably from 50° to 400° C. Particularly, in the case of forming a silicon deposited film with better semiconducting characteristics and photoconductive characteristics, etc., the substrate temperature (Ts) should desirably be made 70° to 350° C. On the other hand, in the case of obtaining a polycrystalline film, it should preferably be 200° to 700° C., more preferably 300° to 600° C.

As the atmosphere temperature (Tat) in the deposition space (A), it may be determined suitably as desired in relationship with the substrate temperature (Ts) so that the above precursors (E) generated and the above precursors (D) are not changed to unsuitable chemical species for film formation, and also the above precursors (E) may be efficiently generated.

Also, in the present invention, the method for forming at least one layer of a semiconducting deposited film controlled in valence electron comprises introducing the precursor (B) which becomes the starting material for formation of a deposited film formed in the decomposition space (B) and the active species (C) interacting with the above precursor (B) formed in the decomposition space (C) separately from each other into the deposition space (A) for formation of a deposited film, thereby forming the layer on the above substrate.

Thus, since no plasma is used in the deposition space (A), the parameters for formation of the deposited film are amounts of the precursors and active species to be introduced, the temperatures of the substrate and in the deposition space (A) and the inner pressure of the deposition space (A), and therefore formation of deposited films can be easily controlled to form deposited films with reproducibility and bulk productivity.

The "precursor" as mentioned in the present invention refers to one which can become the starting material for the deposited film to be formed but can form no or substantially no deposited film under the state of the energy as such. The "active species" refers to one which is responsible for the role of bringing the precursors under the state capable of forming a deposited film by interacting chemically with the precursor to thereby give energy to the precursor or chemically react with the precursor. Accordingly, the active species may contain the constituent element which becomes the constituent element constituting the deposited film to be formed or not contain such a constituent element.

In the present invention, the precursor (B) from the decomposition space (B) to be introduced into the deposition space (A), having its life preferably of 0.01 sec. or longer, more preferably 0.1 sec. or longer, optimally 1 sec. or longer, is selected as desired to be used, and the constituent element of the precursor (B) constitutes the main component constituting the deposited film to be formed in the deposition space (A). Also, the active species (C) introduced from the decomposition space (C) should have its life preferably of 10 sec. or less, more preferably 8 sec. or less, optimally 5 sec. or less. In formation of the deposited film in the deposition space (A), the active species (C) interacts chemically with the above precursor (B) containing the constituent which becomes the main constituent component of the deposited film to be formed simultaneously introduced from the decomposition space (B) into the deposition space (A). As a result, a desired deposited film can be formed easily on a desired substrate.

According to this method, the deposited film formed without exciting plasma within the deposition space (A) will not substantially receive etching action or other bad influences such as abnormal discharging action, etc. Also, by controlling freely as desired the atmosphere temperature of the deposition space (A) and the substrate temperature, more stable CVD method can be practiced. Also, one point of this method different from the CVD method of the prior art is to use active species activated previously in a space different from the deposition space (A). For this reason, the deposition speed can be dramatically accelerated as compared with the CVD method of the prior art, and in addition, the substrate temperature during formation of the deposited film can be made by far lower, whereby deposited films of stable film quality can be presented in large amount and yet at low cost.

The active species to be formed in the decomposition space (C) can be excited not only by energy of discharging, light, heat, etc. or combination thereof, but also it may be formed by contact with or addition of a catalyst, etc.

In the present invention, as the starting material to be introduced into the decomposition space (B) to form the precursor (B), there may be utilized those having atoms or atomic groups with high electron attractive tendency or polar groups bonded to silicon atom. Examples of such compounds may include $Si_nX_{2n+2}$ (n = 1, 2, 3, ..., X=F, Cl, Br, I), $(SiX_2)_n$ (n≧3, X=F, Cl, Br, I), $Si_nHX_{2n+1}$ (n=1, 2, 3, ..., X=F, Cl, Br, I), $Si_nH_2X_{2n}$ (n=1, 2, 3, ..., X=F, Cl, Br, I), etc.

Specifically, there may be employed gaseous or readily gasifiable compounds such as $SiF_4$, $(SiF_2)_5$, $(SiF_2)_6$, $(SiF_2)_4$, $Si_2F_6$, $SiHF_3$, $SiH_2F_2$, $SiCl_4(SiCl_2)_5$, $SiBr_4$, $(SiBr_2)_5$, etc.

Also, $SiH_2(C_6H_5)_2$, $SiH_2(CN)_2$, etc. may be used depending on the purpose of use of the deposited film formed.

By applying decomposition energy onto the compound as described above such as heat, light, discharging, etc., the precursor (B) is formed. The precursors (B) are introduced into the deposition space (A). In this operation, the life of the precursors (B) is required to be desirably 0.01 sec. or longer, thereby promoting deposition efficiency and elevation of the deposition speed and, in the deposition space (A), increasing the efficiency of the activation reaction with the active species (C) introduced from the deposition space (C). During this operation, if desired, formation of a desired deposited film can be accomplished by giving an energy of heat, light, etc. within the deposition space (A) or on the substrate.

In the present invention, the starting material for formation of active species (C) to be introduced into the decomposition space (C) may include $H_2$, $SiH_4$, $SiH_3F$, $SiH_3Cl$, $SiH_3Br$, $SiH_3I$, etc. or otherwise rare gases such as He, Ar, etc.

In the present invention, the ratio of the amount of the precursor (B) introduced from the decomposition space (B) to the amount of the active species (C) introduced from the decomposition space (C) in the deposition space (A) may be determined suitably as desired depending on the decomposition conditions, the kinds of the active species (C), etc., but preferably 10:1 to 1:10 (flow rate ratio introduced), more preferably 8:2 to 4:6.

As the method for forming the precursor (B) and the active species (C) in the decomposition space (B) and the decomposition space (C) in the present invention, excitation energy such as discharging energy, heat energy, light energy, etc. can be used in view of various conditions and device.

Also, for doping of a valence electron controller for controlling valence electron, a starting material for introduction of impurity may be introduced under gaseous state into the decomposition space (B) or (C) during layer formation. It is more preferable to introduce such material into the decomposition space (C) rather than into the decomposition space (B), and introduce the active species therefrom into the deposition space (A).

The valence electron controller to be used in the present invention may include, in the case of silicon-based semiconductor films and germanium based semiconductor films, p-type valence electron controller, namely elements of the group IIIA of the periodic table functioning as the so-called p-type impurity such as B, Al, Ga, In, Tl, etc., and n-type valence electron controller, namely elements of the group VA of the periodic table functioning as the so-called n-type impurity such as N, P, As, Sb, Bi, etc.

As the compound containing the above valence electron controller as constituent element, there may be included $NH_3$, $HN_3$, $N_2H_5N_3$, $N_2H_4$, $NH_4N_3$, $PH_3$, $P_2H_4$, $AsH_3$, $SbH_3$, $BiH_3$, $B_2H_6$, $B_4H_{10}$, $B_5H_9$, $B_5H_{11}$, $B_6H_{10}$, $B_6H_{12}$, $Al(CH_3)_3$, $Al(C_2H_5)_3$, $Ga(CH_3)_3$, $In(CH_3)_3$, etc. as effective ones.

Also, for introducing into the film a band gap regulator for regulating band gap, a starting material for supplying a band gap regulator may be introduced under gaseous state into the decomposition space (B) or (C) during film formation. It is more preferable to introduce such material into the decomposition space (C) rather than into the decomposition space (B), and introduce the active species therefrom into the deposition space (A).

The compounds containing elements for expanding band gap as the band gap regulator to be used in the present invention may include carbon containing compounds, oxygen containing compounds, nitrogen containing compounds, etc.

Specifically, examples of carbon containing compounds may include compounds represented by the formula $C_nH_{2n+2}$ (n is a natural number) such as $CH_4$, $C_2H_6$, $C_3H_8$, $C_4H_{10}$, etc., compounds represented by $C_nH_{2n}$ (n is a natural number) such as $C_2H_4$, $C_3H_6$, $C_4H_8$, etc., compounds such as $C_2H_2$, $C_6H_6$, etc. Examples of oxygen containing compounds may include compounds such as $O_2$, $CO_2$, $NO$, $NO_2$, $N_2O$, $O_3$, $CO$, $H_2O$, $CH_3OH$, $CH_3CH_2OH$, etc.

Examples of nitrogen containing compounds may include $N_2$, $NH_3$, $N_2H_5N_3$, $N_2H_4$, $NH_4N_3$, etc.

On the other hand, compounds containing elements for reducing band gap as the band gap regulator may include chain germanium compounds, tin compounds, etc. as effective ones.

Specifically, examples of chain germanium compounds may include $Ge_mH_{2m+2}'$, $Ge_mF_{2m+2}$ ($m=1, 2, 3, 4, 5$), etc.

Examples of tin compounds may include hydrogenated tin such as $SnH_4$, etc.

The substrate to be used in the present invention may be either electroconductive or electrically insulating, provided that it is selected as desired depending on the use of the thin film multi-layer structure formed. As the electroconductive substrate, there may be mentioned metal such as NiCr, stainless steel, Al, Cr, Mo, Au, Ir, Nb, Ta, V, Ti, Pt, Pd, etc. or alloys thereof As insulating substrates, there may be conventionally be used films or sheets of synthetic resins, including polyester, polyethylene, polycarbonate, cellulose acetate, polypropylene, polyvinyl chloride, polyvinylidene chloride, polystyrene, polyamide, etc., glasses, ceramics, and so on. At least one side surface of these substrates is preferably subjected to treatment for imparting electroconductivity, and it is desirable to provide other layers on the side at which said electroconductive treatment has been applied.

For example, electroconductive treatment of a glass can be effected by providing a thin film of NiCr, Al, Cr, Mo, Au, Ir, Nb, Ta, V, Ti, Pt, Pd, $In_2O_3$, $SnO_2$, ITO ($In_2O_3+SnO_2$) thereon. Alternatively, a synthetic resin film such as polyester film can be subjected to the electroconductive treatment on its surface by vacuum vapor deposition, electron-beam deposition or sputtering of a metal such as NiCr, Al, Ag, Pb, Zn, Ni, Au, Cr, Mo, Ir, Nb, Ta, V, Ti, Pt, etc., or by laminating treatment with said metal, thereby imparting electroconductivity to the surface. The substrate may be shaped in any form such as cylinders, belts, plates or others, and its form may be determined as desired.

The substrate should be preferably selected from among those set forth above in view of adhesion and reactivity between the substrate and the film. Further, if the difference in thermal expansion property between both is great, a large amount of strains may be created within the film to give sometimes no film of good quality, and therefore it is preferable to use a substrate so that the difference in thermal expansion property between both is small.

Also, the surface state of the substrate is directly related to the structure of the film (orientation) or generation of or a stylet structures, and therefore it is desirable to treat the surface of the substrate to give a film structure and a film texture so that desired characteristics may be obtained.

In the folloiwng, an suitable example of a device for embodying the present invention is described in detail by referring to the drawing.

First, FIG. 1 is a schematic constitutional illustration of a device for practicing the method for forming a thin film multi-layer structure of the present invention.

The deposited film forming device shown is broadly classified into a main device, an evacuation system and a gas feeding system.

In the main device, a decomposition space (B) and a decomposition space (C) are provided.

101–108 are respectively bombs filled with the gases to be used during film formation, 101a–108a are respectively gas feeding pipes, 101b–108b are respectively mass flow controllers for controlling the flow rates of the gases from the respective bombs, 101c–108c are respectively gas pressure gauges, 101d–108d and 101e–108e and 130–133 are respectively valves, and 101f–108f are respectively pressure gauges indicating the pressures in the corresponding gas bombs.

120 is a vacuum chamber equipped at the upper portion with a pipeline for gas introduction, having a structure for formation of the reaction space downstream of the pipeline, and also having a structure for formation of a film forming space in which a substrate holder 112 is provided so that a substrate 118 may be provided as opposed to the gas discharging outlet of the pipeline. The pipeline for gas introduction has a triple concentric arrangement structure, having from the innerside a first gas introducing pipe 109 for introducing the gases from the gas bombs 101, 102, a second gas introducing pipe 110 for introducing the gases from the gas bombs 103–105, and a third gas introducing pipe 111 for introducing the gases from the gas bombs 106–108.

Also, to the vacuum chamber 120 are connected activation chambers 126 and 127, and to the activation chamber 126 is connected a microwave power source 128 and to the activation chamber 127 a microwave power source 129, respectively. And, by the microwave power supplied from respective microwave power sources, active species are formed respectively in the decomposition space (B) within the activation chamber 126 and in the decomposition space (C) within the activation chamber 127. The active species forming materials are introduced through the feeding pipelines 134 and 135 into the decomposition spaces (B) and (C) respectively.

The respective gas introducing pipes, the respective gas feeding pipelines and the vacuum chamber 120 was evacuated to vacuum through the main vacuum valve 119 by means of a vacuum evacuation device not shown.

The substrate 118 is set at a suitable desired distance from the positions of the respective gas introducing pipes by moving vertically the substrate holder 112.

In the case of the present invention, the distance between the substrate and the gas discharging outlet of the gas introducing pipe may be determined appropriately in view of the kinds and the desired characteristics of the deposited film formed, the gas flow rates, the inner pressure in the vacuum chamber, etc., but it is preferably several mm to 20 cm, more preferably 5 mm to about 15 cm.

113 is a heater for heating the substrate which is provided in order to heat the substrate to an appropriate temperature during film formation, or preheating the substrate 118 before film formation, or further to anneal the film after film formation.

The substrate heating heater 113 is supplied with power through a conductive wire 114 from a power source 115.

For gas evacuation to the reaction space of each gas introducing pipe, its position is designed so as to be arranged at a position farther from the surface position of the substrate as the pipe is nearer to the inner side. In other words, the gas introducing pipes are arranged so that the pipe on the outer side may enclose the pipe existing within the innerside thereof.

The gases from the respective bombs are fed into the respective introducing pipes through the gas feeding pipelines 123–125, respectively.

116 is a thermocouple for measuring the temperature of the substrate (Ts) and is electrically connected to the temperature display device 117.

By use of such a deposited film forming device, according to the method for forming a thin film multilayer structure member, the methods for preparing a solar battery, an image forming member for electrophotography and a thin film transistor are described in detail below.

(EXAMPLE 1)

Figure 2:
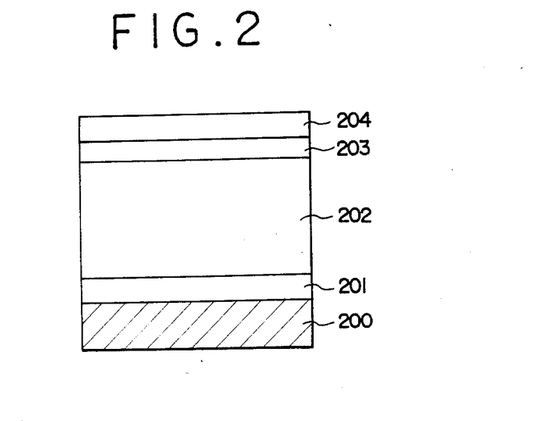
FIG. 2 illustrates schematically the constitution of the solar battery prepared utilizing the method of the present invention.

FIG. 2 illustrates schematically the constitution of the solar battery prepared according to a first example of the present invention.

The solar battery shown in FIG. 2 is constituted of a glass substrate 200 having a transparent electrode vapor deposited thereon, a first layer (amorphous silicon layer doped with boron, thickness 500 Å) 201, a second layer (non-doped amorphous silicon layer, thickness 7000 Å) 202, a third layer (amorphous silicon layer doped with phosphorus, thickness 500 Å) 203 and an Al electrode 204.

In the following, the method for preparing the solar battery is described in detail.

First, the glass substrate having a transparent electrode vapor deposited thereon was placed on the substrate holder 112 in the vacuum chamber 120, and the pressure within the vacuum chamber 120 was made $10^{-6}$ Torr by evacuation. And, the switch of the heater 113 for heating substrate was turned on to set the substrate temperature to 280° C. After the substrate temperature became constantly 280° C., $SiF_4$ gas bomb 101 was opened and $SiF_4$ gas was introduced by the predetermined valve operation at 20 SCCM into the activation chamber 126. Next, hydrogen gas was introduced by the predetermined valve operation from the hydrogen gas bomb 106 at 20 SCCM into the activation chamber 127 and, similarly, $B_2H_6/H_2$ gas mixture was introduced from the $B_2H_6/H_2$ bomb (hydrogen dilution 1000 ppm) 107 at 10 SCCM into the activation chamber 127. After the evacuation valve 119 was controlled so that the inner pressure in the vacuum chamber 120 became 0.4 Torr, the switches of the microwave power sources 128 and 129 were turned on to supply microwave power of 50 W to the activation chamber 126 and also to the activation chamber 127. The activated species formed thereby in the activation chambers 126 and 127 were introduced into the vacuum chamber 120 to form a first layer 201 of amorphous silicon doped with boron to a thickness of 500 Å.

After formation of the first layer, the switches of the microwave power sources 128 and 129 were turned off and, with feeding of all of the above $SiH_4$ gas, $H_2$ gas and $B_2H_6/H_2$ gas mixture being stopped by the predetermined valve operation, the vacuum chamber 120 was evacuated to an inner pressure of $10^{-6}$ Torr.

Next, $SiH_4$ gas bomb 102 was opened and $SiH_4$ gas was introduced by the predetermined valve operation at 20 SCCM through the gas introducing pipe 109 into the vacuum chamber 120. Similarly, $F_2$/He gas was introduced from the $F_2$/He gas (He dilution 10%) at 200 SCCM through the introducing pipe 110 into the vacuum chamber 120. By controlling the evacuation valve 119 so that the inner pressure in the vacuum chamber 120 became 0.8 Torr, a second layer 202 of non-doped amorphous silicon was formed through the oxidation reaction of $SiH_4$ and $F_2$ to a thickness of 7000 Å.

After formation of the second layer, feeding of $SiH_4$ gas and $F_2$/He gas mixture were stopped according to the predetermined operation, and the vacuum chamber 120 was evacuated to $10^{-6}$ Torr.

The third layer 203 of amorphous silicon doped with phosphorus can be formed according to the same procedure as in formation of the first layer 201, but the $PH_4/H_2$ bomb ($H_2$ dilution 1000 ppm) 107 is employed in place of the $B_2H_6/H_2$ bomb.

After having thus formed the first to third layers on the substrate 200, the product was cooled and taken out from the vacuum chamber 120, followed by vapor deposition of an Al electrode 204 on the third layer 203.

When the solar battery thus formed was irradiated with light (AM-1) for measurement of energy conversion efficiency, it was found to be improved by 10% as compared with that of the prior art.

The preparation conditions as described above are shown in Table 1.

TABLE 1

(Substrate temperature 280° C.)

| Layer structure | Starting materials | Flow rate (SCCN) | Pressure (Torr) | Deposition method |
| --- | --- | --- | --- | --- |
| First layer | $SiF_4$<br>$H_2$<br>$B_2H_6/H_2$<br>(= 1000 ppm) | 20<br>20<br>10 | 0.4 | $SiF_4$ activated in activation space (B);<br>$H_2$ and $B_2H_6$ activated in activation space (C);<br>Deposited film formed by the reaction between the above active species. |
| Second layer | $SiH_4$<br>$F_2$/He = 1/10 | 20<br>200 | 0.8 | Deposited film formed by the oxidation reaction of $SiH_4$ and $F_2$ |
| Third layer | $SiF_4$<br>$H_2$<br>$PH_3/H_2$<br>(= 1000 ppm) | 20<br>20<br>10 | 0.4 | Deposited film formed similarly as First layer |

(EXAMPLE 2)

Figure 3:
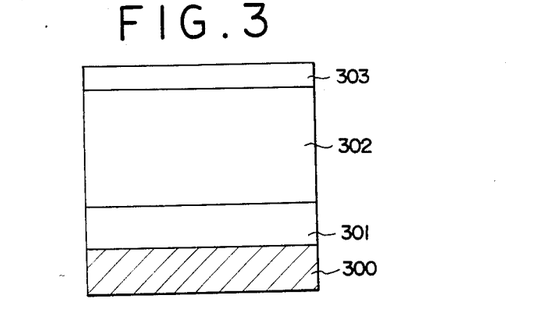
FIG. 3 illustrates schematically the constitution of the image forming member for electrophotography utilizing the method of the present invention.

FIG. 3 illustrates schematically the constitution of the image forming member prepared according to a second example of the present invention.

The image forming member shown in FIG. 3 is constituted of an Al substrate 300, a first layer (amorphous silicon layer doped with boron, thickness 3 μm) 301, a second layer (non-doped amorphous silicon layer, thickness 20 μm) and a third layer (amorphous silicon layer containing carbon, thickness 0.5 μm) 303.

The first layer 301 and the second layer 302 were formed according to the same procedures as in Example 1. The third layer 303 was formed by using the gas mixture of $SiH_4$ gas and $CH_4$ gas ($SiH_4/CH_4 = 1/10$) bomb in place of the $SiF_4$ gas bomb 101, introducing the $SiH_4/CH_4$ gas mixture at 110 SCCM through the introducing pipe 109 into the vacuum chamber 120, subsequently the F$_2$/He gas mixture from the F$_2$/He gas mixture bomb 103 at 1500 SCCM through the introducing pipe 110 into the vacuum chamber 120, wherein the oxidation reaction of SiH$_4$, CH$_4$ and F$_2$ was effected to form the third layer 303.

When electrophotographic characteristics were measured for the image forming member for electrophotography formed as described above, charging capacity was found to be improved by 10% and sensitivity by 12%, as compared with the image forming member for electrophotography of the prior art.

The preparation conditions as described above are shown in Table 2.

TABLE 2

(Substrate temperature 280° C.)

| Layer structure | Starting materials | Flow rate (SCCM) | Pressure (Torr) | Deposition method |
|---|---|---|---|---|
| First layer | SiF$_4$ | 20 | 0.3 | SiF$_4$ activated in activation space (B); |
|  | H$_2$ | 20 |  |  |
|  | B$_2$H$_6$/H$_2$ (= 1000 ppm) | 20 |  | H$_2$ and B$_2$H$_6$ activated in activation space (C); Deposited film formed by the reaction between the above active species. |
| Second layer | SiH$_4$ | 100 | 0.8 | Deposited film formed by the oxidation reaction of SiH$_4$ and F$_2$ |
|  | F$_2$/He (= 1/10) | 1000 |  |  |
| Third layer | SiH$_4$/CH$_4$ (= 1/10) | 110 | 0.8 | Deposited film formed by the oxidation reaction of SiH$_4$, CH$_4$ and F$_2$ |
|  | CH$_4$ | 100 |  |  |
|  | F$_2$/He(= 1/10) | 1500 |  |  |

By use of such a deposited film forming device, according to the method for forming thin film multilayer structure, the methods for preparing a solar battery, an image forming member for electrophotography and a thin film transistor are described in detail below.

(EXAMPLE 3)

The solar battery prepared according to this Example has the same layer constitution as that of the solar battery schematically shown in FIG. 2.

The solar battery is constituted of a glass substrate 200 having a transparent electrode vapor deposited thereon, a first layer (amorphous silicon carbide layer doped with boron, thickness 500 Å) 201, a second layer (non-doped amorphous silicon layer, thickness 7000 Å) 202, a third layer (amorphous silicon layer doped with phosphorus, thickness 500 Å) 203 and an Al electrode 204.

In the following, the method for preparing the solar battery by use of the device shown in FIG. 1 is described in detail.

First, the glass substrate having a transparent electrode vapor deposited thereon was placed on a substrate holder 112 in the vacuum chamber 120, and the pressure within the vacuum chamber was made 10$^{-6}$ Torr by evacuation. And, the switch of the heater 13 for heating substrate was turned on to set the substrate temperature to 280° C. After the substrate temperature became constantly 280° C., SiF$_4$ gas bomb 101 was opened and SiF$_4$ gas was introduced by the predetermined valve operation at 20 SCCM into the activation chamber 126. Next, hydrogen gas was introduced by the predetermined valve operation from the hydrogen gas bomb 106 at 20 SCCM into the activation chamber 127 and, similarly, B$_2$H$_6$/H$_2$ gas mixture was introduced form the B$_2$H$_6$/H$_2$ bomb (hydrogen dilution 1000 ppm) 107 at 10 SCCM into the gas activation chamber 127, and C$_2$H$_4$ gas from the C$_2$H$_4$ gas bomb at 2 SCCM into the activation chamber 127. After the evacuation valve 119 was controlled so that the inner pressure in the vacuum chamber 120 became 0.4 Torr, the switches of the microwave power sources 128 and 129 were turned on to supply microwave power of 50 W to the activation chamber 126 and also to the activation chamber 127. The activated species formed thereby in the activation chambers 126 and 127 were introduced into the vacuum chamber 120 to form a first layer 201 of amorphous silicon carbide doped with boron to a thickness of 500 Å.

After formation of the first layer, the switches of the microwave power sources 128 and 129 were turned off and, with feeding of all of the above SiH$_4$ gas, H$_2$ gas and B$_2$H$_6$/H$_2$ gas mixture being sopped by the predetermined valve operation, the vacuum chamber 120 was evacuated to an inner pressure of 10$^{-6}$ Torr.

Next, SiH$_4$ gas bomb 102 was opened and SiH$_4$ gas was introduced by the predetermined valve operation at 20 SCCM through the gas introducing pipe 109 into the vacuum chamber 120. Similarly, F$_2$/He gas was introduced from the F$_2$/He gas (He dilution 10%) at 200 SCCM through the introducing pipe 110 into the vacuum chamber 120. By controlling the evacuation valve 119 so that the inner pressure in the vacuum chamber 120 became 0.8 Torr, a second layer 202 of non-doped amorphous silicon was formed through the oxidation reaction of SiH$_4$ and F$_2$ to a thickness of 7000 Å.

After formation of the second layer, feeding of SiH$_4$ gas and F$_2$/He gas mixture were stopped according to the predetermined operation, and the vacuum chamber 120 was evacuated to 10$^{-6}$ Torr.

The third layer 203 of amorphous silicon doped with phosphorus can be formed according to the same procedure as in formation of the first layer 201, but the PH$_4$/H$_2$ bomb (H$_2$ dilution 1000 ppm) 107 is employed in place of the B$_2$H$_6$/H$_2$ bomb.

After having thus formed the first to third layers on the substrate 200, the product was cooled and taken out from the vacuum chamber 120, followed by vapor deposition of an Al electrode 204 on the third layer 203.

When the solar battery thus formed was irradiated with light (AM-1) for measurement of energy conversion efficiency, it was found to be improved by 10% as compared with that of the prior art.

The preparation conditions as described above are shown in Table 3.

TABLE 1

(Substrate temperature 280° C.)

| Layer structure | Starting materials | Flow rate (SCCM) | Pressure (Torr) | Deposition method |
|---|---|---|---|---|
| First layer | $SiF_4$ | 20 | 0.4 | $SiF_4$ activated in activation space (B); |
| | $H_2$ | 20 | | |
| | $B_2H_6/H_2$ (= 1000 ppm) | 10 | | $H_2$, $B_2H_6$, $C_2H_4$ activated in activation space (C); |
| | $C_2H$ | 2 | | above active species reacted in deposition space to form deposited film |
| Second layer | $SiH_4$ | 20 | 0.8 | Deposited film formed by oxidation reaction of $SiH_4$ and $F_2$ |
| | $F_2/He = 1/10$ | 200 | | |
| Third layer | $SiF_4$ | 20 | 0.4 | Deposited film formed similarly as First layer |
| | $H_2$ | 20 | | |
| | $PH_3/H_2$ (= 1000 ppm) | 10 | | |

(EXAMPLE 4)

The image forming member for electrophotography prepared according to this Example has the same layer constitution as that of the image forming member for electrophotography schematically shown in FIG. 3.

The image forming member is constituted of an Al substrate 300, a first layer (amorphous silicon layer doped with boron, thickness 3 μm) 301, a second layer (non-doped amorphous silicon layer, thickness 20 μm) 302 and a third layer (amorphous silicon layer containing carbon, thickness 0.5 μm) 303.

The first layer 301 was formed according to the same procedure as in Example 3 as shown in Table 4 by use of NO gas bomb in place of the $C_2H_4$ gas bomb 108. The second layer 302 was also formed according to the same procedure as in Example 3 as shown in Table 4. The third layer 303 was formed by using the gas mixture of $SiH_4$ gas and $CH_4$ gas ($SiH_4/CH_4 = 1/10$) bomb in place of the $SiF_4$ gas bomb 101, introducing the $SiH_4/CH_4$ gas mixture at 110 SCCM through the introducing pipe 109 into the vacuum chamber 120, subsequently the $F_2/He$ gas mixture from the $F_2/He$ gas mixture bomb 103 at 1500 SCCM through the introducing pipe 110 into the vacuum chamber 120, wherein the oxidation reaction of $SiH_4$, $CH_4$ and $F_2$ was effected to form the third layer 303.

When electrophotographic characteristics were measured for the image forming member for electrophotography formed as described above, charging capacity was found to be improved by 10% and sensitivity by 12%, as compared with the image forming member for electrophotography of the prior art.

The preparation conditions as descrbed above are shown in Table 4.

TABLE 2

(Substrate temperature 280° C.)

| Layer structure | Starting materials | Flow rate (SCCM) | Pressure (Torr) | Deposition method |
|---|---|---|---|---|
| First layer | $SiF_4$ | 20 | 0.3 | $SiF_4$ activated in activation space (B); |
| | $H_2$ | 20 | | |
| | $B_2H_6/H_2$ (= 1000 ppm) | 20 | | $H_2$ and $B_2H_6$ and NO activated in activation space (C); |
| | NO | 1 | | Deposited film formed by the reaction between the above active species. |
| Second layer | $SiH_4$ | 100 | 0.8 | Deposited film formed by the oxidation reaction of $SiH_4$ and $F_2$ |
| | $F_2He (= 1/10)$ | 1000 | | |
| Third layer | $SiH_4/CH_4$ (= 1/10) | 110 | 0.8 | Deposited film formed by oxidation reaction of $SiH_4$, $CH_4$ and $F_2$ |
| | $CH_4$ | 100 | | |
| | $F_2/He (= 1/10)$ | 1500 | | |

(EXAMPLE 5)

Figure 4:
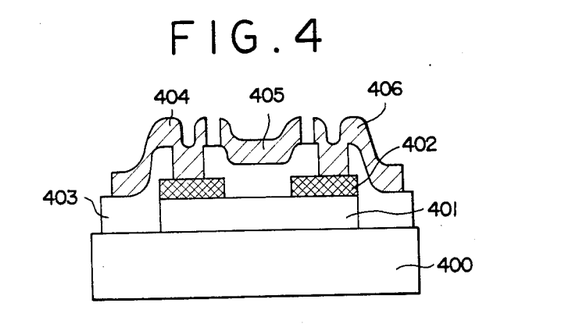
FIG. 4 is a schematic constitutional illustration of the thin film transistor prepared utilizing the method of the present invention.

FIG. 4 illustrates schematically the constitution of a thin film transistor prepared according to a third example of the present invention.

The thin film transistor in FIG. 4 is constituted of a glass substrate 400, a first layer (amorphous silicon layer, thickness 1 μm) 401, a second layer (amorphous silicon layer doped with phosphorus to a high concentration, thickness 500 Å) 402, a third layer (amorphous silicon nitride layer, thickness 0.1 μm) 403, a source electrode (Al) 404, a gate electrode (Al) 405 and a drain electrode (Al) 406.

Such a thin film transistor was prepared in the same manner as in Example 3 under the conditions shown in Table 5.

The thin film transistor prepared by this Example was found to be improved in switching characteristic by 20%.

TABLE 3

| | | (Substrate temperature 250° C.) | | |
|---|---|---|---|---|
| Layer structure | Starting material | Flow rate (SCCM) | Pressure (Torr) | Deposition method |
| First layer | $SiF_4$<br>$F_2/He$ | 20<br>20 | 0.8 | Deposited film formed by oxidation reaction of $SiH_4$ and $F_2$ |
| Second layer | $SiF_4$<br>$H_2$<br>$PH_3/H_2$<br>= 1000 ppm | 20<br>20<br>4 | 0.3 | $SiF_4$ activated in activation space (B); $H_2$ and $PH_3$ activated in activation space (C); above active species reacted in deposition space (A) to form deposition film |
| Third layer | $SiF_4$<br>$H_2$<br>$NH_3$ | 20<br>100<br>100 | 0.3 | $SiF_4$ activated in activation space (B); $H_2$ and $NH_3$ activated in activation space (C); above active species reacted in deposition space (A) to form deposition film |

As described in detail above, the thin film multi-layer structure formed according to the present invention is improved in interface characteristics and therefore semiconductor devices having excellent characteristics can be obtained as shown by respective Examples.

Also, the method for forming a thin film multilayer structure member according to the present invention effects conservation of energy and at the same time gives deposited films having uniform physical characteristics over large area with easy management of film quality. Also, it is possible to obtain easily multi-layer structure members in productivity, bulk productivity, having high quality with excellent physical properties such as electrical, optical and semiconducting properties, etc.

We claim:

1. A method for forming a thin film multi-layer structure on a substrate in a deposition space (A) having at least a first layer of semiconductor thin film controlled in valence electron and at least a second layer of semiconductor thin film regulated in band gap, which comprises:

forming at least one of said first and second thin film layers on said substrate by separately introducing by a first gas introducing conduit system a precurs (B) formed in a decomposition space (B) which becomes the semiconductor starting material for said at least one of said first and second thin film layers and an active species (C) formed in a decomposition space (C) capable of a chemical reaction with said precursor (B) into said deposition space (A) to form a mixture and effect chemical contact therebetween and thereby effect the formation of said at least one said first and second thin film layers;

forming at least the other of said first and second thin film layers by introducing by a second gas introducing conduit system a gaseous starting material (a) for thin film formation and a gaseous halogenic oxidizing agent having the property of oxidation action on said gaseous semiconductor starting material (a) into said deposition space (A) to form a mixture and effect chemical contact therebetween to thereby form a plural number of precursors including precursors under excited state and thereby effect the formation of said other of said first and second thin film layers using at least one of said precursors as the feeding source for the constituent element of said other of said first and second thin film layers; said second gas introducing conduit system including a plurality of coaxially aligned conduits each having an exit orifice with an outer conduit adapted to carry said gaseous halogenic oxidizing agent and at least one inner conduit adapted to carry said gaseous starting material (a), said coaxially aligned conduits extending into the deposition space (A) such that the exit orifices of the inner conduits are set back from the exit orifice of the outer conduit to enable the gaseous halogenic oxidizing agent in the outer conduit to surround the gaseous starting material (a) exiting said inner conduit, said substrate positioned from several millimeters to 20 centimeters from the exit orifice of said outer conduit;

introducing into said deposition space (A) during the formation of said first layer, a substance which includes a valence electron controller so as to form a semiconductor thin film controlled in valence electron; and introducing into said deposition space (A) during the formation of said second layer, a substance which includes a band gap regulator so as to form a semiconductor thin film regulated in band gap.

2. The method according to claim 1, wherein said gaseous starting material (a) is selected from chain silane compounds, cyclic silane compounds, chain germanium compounds and hydrogenated tin.

3. The method according to claim 1, wherein said gaseous halogenic oxidizing agent is selected from $F_2$, $Cl_2$, $Br_2$ and $I_2$.

4. The method according to claim 1, wherein said gaseous halogenic oxidizing agent is selected from fluorine, chlorine and bromine under nascent state.

5. The method according to claim 1, wherein the ratio of the amount of said gaseous starting material (a) and the amount of said halogenic oxidizing agent introduced into the reaction space is 1/20–100/1.

6. The method according to claim 1, wherein the gaseous starting material to be introduced into the decomposition space (B) to form the precursor (B) is selected from $SiF_4$, $(SiF_2)_5$, $(SiF_2)_6$, $(SiF_2)_4$, $Si_2F_6$, $SiHF_3$, $SiH_2F_2$, $SiCl_4(SiCl_2)_5$, $SiBr_4$, $(SiBr_2)_5$, $SiH_2(C_6H_5)_2$, and $SiH_2(CN)_2$.

7. The method according to claim 1, wherein the gaseous starting material to be introduced into the decomposition space (C) to form the active species (C) is selected from $H_2$, $SiH_4$, $SiH_3F$, $SiH_3Cl$, $SiH_3Br$, $SiH_3I$, He and Ar.

* * * * *

UNITED STATES PATENT AND TRADEMARK OFFICE
CERTIFICATE OF CORRECTION

PATENT NO. : 4,801,474
DATED : January 31, 1989
INVENTOR(S) : KEISHI SAITOH, ET AL.          Page 1 of 2

It is certified that error appears in the above-identified patent and that said Letters Patent is hereby corrected as shown below:

COLUMN 12

Line 7, "$F_2$/He gas (He dilution 10%)" should read --$F_2$/He gas bomb (He dilution 10%) 103--.

Line 61, "20 µm and)" should read --20 µm) 302 and--.

COLUMN 13

Line 58, "heater 13" should read --heater 113--.

COLUMN 14

Line 43, "$F_2$/He gas (He dilution 10%)" should read --$F_2$/He gas bomb (He dilution 10%) 103--.

COLUMN 15

Table 1, "TABLE 1" should read --TABLE 3--.

COLUMN 15-6

Table 2, "$F_2$He(=1/10)" should read --$F_2$/He(=1/10)--.

UNITED STATES PATENT AND TRADEMARK OFFICE
CERTIFICATE OF CORRECTION

PATENT NO. : 4,801,474

DATED : January 31, 1989

INVENTOR(S) : KEISHI SAITOH, ET AL.

It is certified that error appears in the above-identified patent and that said Letters Patent is hereby corrected as shown below:

COLUMN 16

Table 2, "TABLE 2" should read --TABLE 4--.

COLUMN 17

Line 44, "precurs" should read --precursor--.

Table 3, "TABLE 3" should read --TABLE 5--.

Signed and Sealed this

Twenty-eighth Day of November 1989

Attest:

JEFFREY M. SAMUELS

Attesting Officer     Acting Commissioner of Patents and Trademarks